(12) United States Patent
Kozuru et al.

(10) Patent No.: US 10,079,470 B2
(45) Date of Patent: Sep. 18, 2018

(54) LIGHT EMITTING DEVICE

(71) Applicant: NICHIA CORPORATION, Anan-shi (JP)

(72) Inventors: Kazuma Kozuru, Anan (JP); Shinichi Nagahama, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 252 days.

(21) Appl. No.: 14/689,984

(22) Filed: Apr. 17, 2015

(65) Prior Publication Data

US 2015/0303648 A1 Oct. 22, 2015

(30) Foreign Application Priority Data

Apr. 18, 2014 (JP) ................................. 2014-086931

(51) Int. Cl.
*F21V 1/00* (2006.01)
*F21V 11/00* (2015.01)
(Continued)

(52) U.S. Cl.
CPC ................ *H01S 5/005* (2013.01); *F21K 9/64* (2016.08); *F21V 13/08* (2013.01); *F21V 29/74* (2015.01);
(Continued)

(58) Field of Classification Search
CPC .... H01S 5/005; H01S 5/02248; H01S 5/0071; H01S 5/02208; H01S 5/02469;
(Continued)

(56) References Cited

U.S. PATENT DOCUMENTS

2006/0198404 A1* 9/2006 Henrichs ............. H01S 5/18391
372/29.02
2007/0047603 A1* 3/2007 Oomori ................ H04B 10/572
372/34
(Continued)

FOREIGN PATENT DOCUMENTS

DE 112014002330 A5 * 1/2016 ......... H01S 5/02212
JP 2008-305936 A 12/2008
(Continued)

OTHER PUBLICATIONS

Machine English Translation of Japanese Application 2014-080595 Apr. 9, 2014. Provided for US 2015/0292687.*
(Continued)

*Primary Examiner* — Karabi Guharay
*Assistant Examiner* — Glenn Zimmerman
(74) *Attorney, Agent, or Firm* — Foley & Lardner LLP

(57) ABSTRACT

A light emitting device includes: a base; at least one semiconductor laser element disposed on the base and configured to emit light laterally; a reflecting member that is disposed on the base; a surrounding part that is disposed on the base and that surrounds the at least one semiconductor laser element and the reflecting member; a wiring part that is electrically connected to the at least one semiconductor laser element and that is disposed on an upper surface of the base so as to extend laterally to a location on the upper surface of the base that is laterally outside of the surrounding part; a radiating body disposed on the surrounding part, the radiating body comprising at least one of a metal and a ceramic, and the radiating body having an opening; and a wavelength converting member that is located in the opening of the radiating body.

28 Claims, 3 Drawing Sheets

(51) Int. Cl.
 *H01S 5/00* (2006.01)
 *F21V 13/08* (2006.01)
 *F21V 29/74* (2015.01)
 *F21K 9/64* (2016.01)
 *H01S 5/024* (2006.01)
 *H01S 5/022* (2006.01)
 *H01S 5/40* (2006.01)
 *F21Y 101/00* (2016.01)
 *F21Y 115/30* (2016.01)

(52) U.S. Cl.
 CPC ....... *H01S 5/02248* (2013.01); *F21Y 2101/00* (2013.01); *F21Y 2115/30* (2016.08); *H01L 2224/48091* (2013.01); *H01S 5/0071* (2013.01); *H01S 5/02208* (2013.01); *H01S 5/02469* (2013.01); *H01S 5/4056* (2013.01)

(58) Field of Classification Search
 CPC ........ H01S 5/4056; F21V 29/74; F21V 13/08; F21Y 2115/30; F21Y 2101/00; F21K 9/64; H01L 2224/48091
 USPC .............. 362/235, 249.02, 249.01, 259, 260; 257/98, 99
 See application file for complete search history.

(56) References Cited

U.S. PATENT DOCUMENTS

| | | | |
|---|---|---|---|
| 2008/0116473 A1* | 5/2008 | Sugiyama | H01L 33/483 257/98 |
| 2008/0192787 A1* | 8/2008 | Yamamoto | H01S 5/4031 372/44.01 |
| 2009/0003400 A1* | 1/2009 | Nagahama | H01L 33/483 372/50.23 |
| 2010/0148203 A1 | 6/2010 | Hashimoto et al. | |
| 2011/0133222 A1* | 6/2011 | Allen | F21K 9/233 257/88 |
| 2011/0216550 A1* | 9/2011 | Koike | F21S 48/1145 362/519 |
| 2011/0280020 A1* | 11/2011 | Chen | F21V 5/007 362/294 |
| 2011/0310362 A1 | 12/2011 | Komatsu | |
| 2012/0039072 A1* | 2/2012 | Lell | H04N 9/3161 362/227 |
| 2012/0138974 A1* | 6/2012 | Yoo | H01L 33/486 257/88 |
| 2012/0236582 A1* | 9/2012 | Waragaya | H01L 33/507 362/510 |
| 2012/0242912 A1* | 9/2012 | Kitano | H04N 9/3111 348/759 |
| 2013/0039374 A1* | 2/2013 | Lutgen | H04N 9/3161 372/43.01 |
| 2013/0043499 A1* | 2/2013 | Ohta | H01L 33/483 257/98 |
| 2013/0107523 A1 | 5/2013 | Takeda | |
| 2013/0229631 A1* | 9/2013 | Toyooka | G03B 21/204 353/31 |
| 2013/0272329 A1* | 10/2013 | Auen | H01S 5/024 372/34 |
| 2013/0329397 A1* | 12/2013 | Shimizu | F21V 29/20 362/84 |
| 2015/0292687 A1* | 10/2015 | Sugiyama | F21K 9/56 362/259 |
| 2016/0087399 A1* | 3/2016 | Horn | H01S 5/02212 372/50.121 |
| 2017/0097561 A1 | 4/2017 | Komatsu | |

FOREIGN PATENT DOCUMENTS

| | | |
|---|---|---|
| JP | 2009-289976 A | 12/2009 |
| JP | 04-823300 B2 | 11/2011 |
| JP | 2012-003923 A | 1/2012 |
| JP | 2012-022802 A | 2/2012 |
| JP | 2012-094728 A | 5/2012 |
| JP | 2012-512508 A | 5/2012 |

OTHER PUBLICATIONS

Japanese Application 2014-080595 Apr. 9, 2014. Provided for US 2015/0292687.*

Machine English Translation of DE112014002330A5 Nov. 13, 2014.*

* cited by examiner

LIGHT EMITTING DEVICE

CROSS-REFERENCE TO RELATED APPLICATIONS

The present application claims priority to Japanese Patent Application No. 2014-086931, filed on Apr. 18, 2014, which is incorporated by reference in its entirety.

BACKGROUND

1. Field

The present disclosure relates to a light emitting device.

2. Description of the Related Art

Conventionally, a light emitting device provided with a plurality of semiconductor laser elements (LD 16) and a wavelength converting member (fluorescent body layer 65) on a base (radiator 17) has been proposed (refer to Japanese Patent Application Laid-open No. 2012-22802).

SUMMARY

An object of the present disclosure is to provide a light emitting device with high heat dissipation performance.

A light emitting device includes: a base; a plurality of semiconductor laser elements that are disposed on the base and that are configured to emit light laterally from the plurality of semiconductor laser elements; a reflecting member that is disposed on the base and configured to reflect light from the plurality of semiconductor laser elements; a surrounding part that is disposed on the base and that surrounds the plurality of semiconductor laser elements and the reflecting member; a wiring part that is disposed on the base so as to extend to a location outside of the surrounding par, the wiring part being electrically connected to the plurality of semiconductor laser elements; a radiating body disposed on the surrounding part, the radiating body comprising at least one of a metal and a ceramic, and the radiating body having an opening; and a wavelength converting member that is located in the opening of the radiating body, the wavelength converting member being configured to convert a wavelength of light that is emitted from the plurality of semiconductor laser elements and reflected upward by the reflecting member.

Deterioration of semiconductor laser elements and deterioration of a wavelength converting member can be suppressed.

DETAIL DESCRIPTION

[Light Emitting Device 1 According to First Embodiment]

Figure 1A:
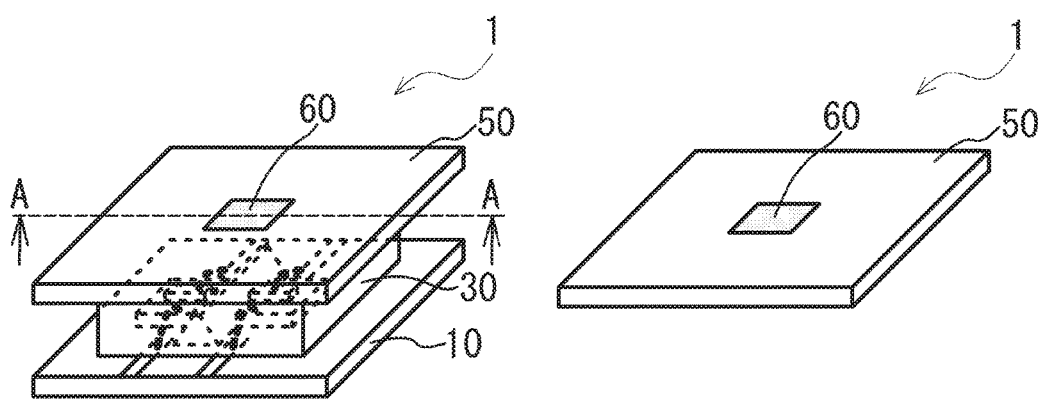
FIG. 1A is a schematic perspective view of a light emitting device according to a first embodiment.
Figure 1C:
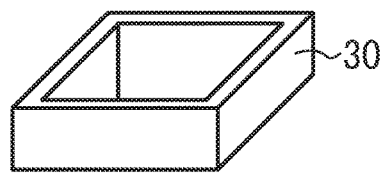
FIG. 1C is a schematic end view taken along a line A-A in FIG. 1A.
Figure 1C:
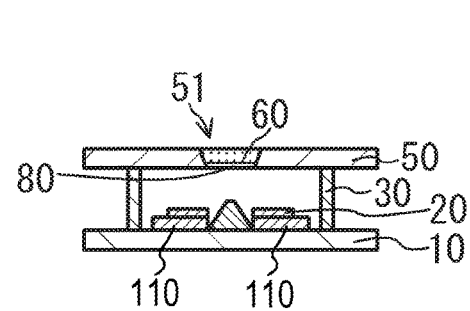
Figure 1B:
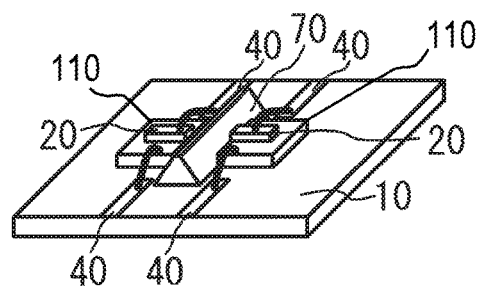
FIG. 1B is a schematic exploded view in FIG. 1A.

FIG. 1A is a schematic perspective view of a light emitting device 1 according to a first embodiment, FIG. 1B is an schematic exploded view in FIG. 1A, and FIG. 1C is a schematic end view taken along a line A-A in FIG. 1A.

In FIG. 1A, portions of members are transparently shown using dashed lines in order to facilitate understanding.

As shown in FIG. 1A to 1C, the light emitting device 1 includes: a base 10; a plurality of semiconductor laser elements 20 that are disposed on the base 10 and that are configured to emit light laterally from the plurality of semiconductor laser elements; a reflecting member 70 that is disposed on the base 10 and configured to reflect light from the plurality of semiconductor laser elements 20; a surrounding part 30 that is disposed on the base 10 and that surrounds the plurality of semiconductor laser elements 20 and the reflecting member 70; a wiring part 40 that is disposed on the base 10 so as to extend to a location outside of the surrounding part 30, the wiring part being electrically connected to the plurality of semiconductor laser elements 20; a radiating body 50 disposed on the surrounding part, the radiating body comprising at least one of a metal and a ceramic, and the radiating body having an opening 51; and a wavelength converting member 60 that is located in the opening 51 of the radiating body 50, the wavelength converting member being configured to convert a wavelength of light that is emitted from the plurality of semiconductor laser elements 20 and reflected upward by the reflecting member 70.

When a light emitting device includes a plurality of semiconductor laser elements, discharge of heat generated at each of the semiconductor laser elements from a base is inhibited. Therefore, heat is likely to accumulate in the semiconductor laser elements and, as a result, the semiconductor laser elements deteriorate faster.

In consideration thereof, in the light emitting device 1, each of the semiconductor laser elements 20 is arranged on the base 10 so that light is emitted to the side in a lateral direction. Accordingly, since distances from the semiconductor laser elements 20 to the base 10 are reduced and heat radiation performance is improved, deterioration of the semiconductor laser elements 20 can be suppressed.

In addition, when a light emitting device includes a plurality of semiconductor laser elements, since light emitted from the plurality of semiconductor laser elements enters a wavelength converting member, the amount of heat generated at the wavelength converting member increases. As a result, the wavelength converting member deteriorates faster. In consideration thereof, in the light emitting device 1, the wavelength converting member 60 is provided on the radiating body 50 containing at least one of metals and ceramics. Accordingly, since heat generated at the wavelength converting member 60 can be released using the radiating body 50, deterioration of the wavelength converting member 60 can be suppressed.

Hereinafter, primary members and the like of the light emitting device 1 will be described in order.

(Light Emitting Device 1)

The light emitting device 1 can be preferably used as, for example, a surface-mounted light emitting device.

(Base 10)

As the base 10, a member containing ceramics such as aluminum nitride and aluminum oxide can be used.

Heat generated by the plurality of semiconductor laser elements 20 is released via the base 10.

(Plurality of Semiconductor Laser Elements 20)

The plurality of semiconductor laser elements 20 are arranged on the base 10 so that light is emitted to the side.

The semiconductor laser elements 20 may be directly provided on the base 10 or may be provided on the base 10 via a sub-mount 110. Examples of a material of the sub-mount 110 are aluminum nitride or silicon carbide.

Nitride semiconductor laser elements or the like can be used as the semiconductor laser elements 20.

Light emitted to the side by the plurality of semiconductor laser elements 20 is reflected by the reflecting member 70, changes its direction to upward, and enters the wavelength converting member 60 provided in the opening 51 of the radiating body 50.

As shown in FIG. 1B, since the semiconductor laser elements 20 are provided so that main surfaces thereof face the base 10, heat from the semiconductor laser elements 20 can be efficiently discharged via the base 10. Either of an n electrode or a p electrode is provided on the main surface (lower surface of the semiconductor laser elements 20 in FIG. 1A to 1C) of the semiconductor laser elements 20 on the side of the base 10, and the electrode is electrically connected to the wiring part 40, for example, via a sub-mount 110.

In addition, a main surface (upper surface of the semiconductor laser elements 20 in FIG. 1A to 1C) opposite to the main surface (lower surface of the semiconductor laser elements 20 in FIG. 1A to 1C) described above is provided with the other electrode of an n electrode and a p electrode, and the electrode is electrically connected to the wiring part 40, for example, via a metal wire.

The number of semiconductor laser elements 20 to be provided in one light emitting device 1 is at least 2 or more and can be, for example, 10 or more. By increasing a package size, around 10 to 100 semiconductor laser elements 20 can be provided in one light emitting device 1.

When arranging a plurality of semiconductor laser elements 20 on one side of the reflecting member 70, a distance between adjacent semiconductor laser elements 20 can be set to, for example, 200 µm or more and 1000 µm or less.

(Reflecting Member 70)

The reflecting member 70 is a member that reflects light from the plurality of semiconductor laser elements 20 toward the wavelength converting member 60 and which is provided on the base 10.

A shape of the reflecting member 70 is not particularly limited.

For example, when the reflecting member 70 is positioned between a plurality of semiconductor laser elements 20, a member with an approximately triangular prism shape (with a triangle-like trapezoidal section) as shown in FIG. 1A to 1C or the like can be used as the reflecting member 70.

As the reflecting member 70, for example, optical glass made of synthetic quartz or the like in which a portion to be irradiated by laser light is provided with a reflective film can be used.

Since such members exhibit high heat resistance, the members can be used with less deterioration even when irradiated with light from the plurality of semiconductor laser elements 20.

As the reflective film, a metal film made of silver, aluminum, or the like or a dielectric multilayer film in which oxide films of silicon oxide or tantalum oxide or the like are laminated can be used.

(Surrounding Part 30)

The surrounding part 30 is provided on the base 10, and surrounds the plurality of semiconductor laser elements 20 and the reflecting member 70.

Accordingly, since light output of the plurality of semiconductor laser elements 20 is prevented from declining due to optical dust collection or the like, the life of the light emitting device 1 can be prolonged.

Ceramics or metals such as iron can be used for the surrounding part 30.

(Wiring Part 40)

The wiring part 40 is provided on the base 10 so as to extend to the outside of the surrounding part 30, i.e., to the outside of a peripheral edge of the surrounding part 30.

Accordingly, since the wiring part 40 need not be arranged below the base 10, an entire lower surface of the base 10 can be used as a heat radiating surface.

In other words, heat generated by the plurality of semiconductor laser elements 20 is released via the base 10 in an efficient manner.

The wiring part 40 is electrically connected to the plurality of semiconductor laser elements 20.

By energizing the wiring part 40, power can be supplied to the plurality of semiconductor laser elements 20.

The wiring part 40 is divided into an anode (p electrode side) and a cathode (n electrode side).

While the anode and the cathode are extracted outward in different directions in the light emitting device 1 shown in FIG. 1A to 1C, the anode and the cathode may alternatively be extracted in a same direction.

(Radiating Body 50)

The radiating body 50 is provided on the surrounding part 30.

By constructing the radiating body 50 and the surrounding part 30 with separate members, since a heat radiating path of the wavelength converting member 60 can be more readily secured separately from a heat radiating path of the semiconductor laser elements 20, heat generated at the wavelength converting member 60 is efficiently radiated via the radiating body 50.

Figure 2A:
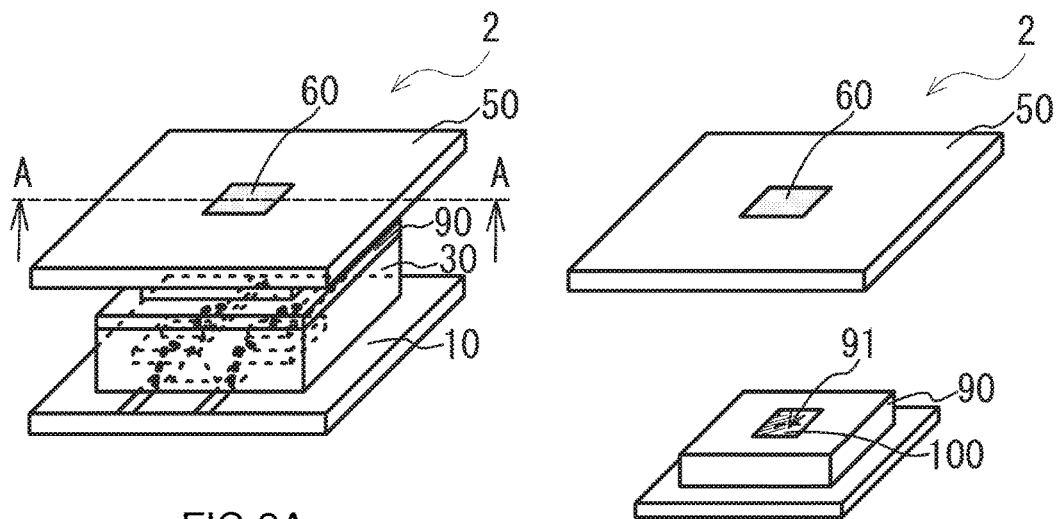
FIG. 2A is a schematic perspective view of a light emitting device according to a second embodiment.
Figure 2C:
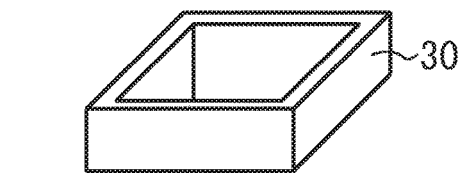
FIG. 2C is a schematic end view taken along a line A-A in FIG. 2A.
Figure 2C:
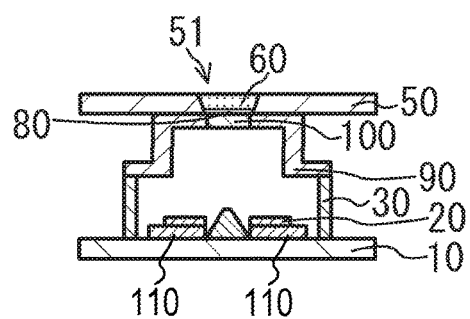
Figure 2B:
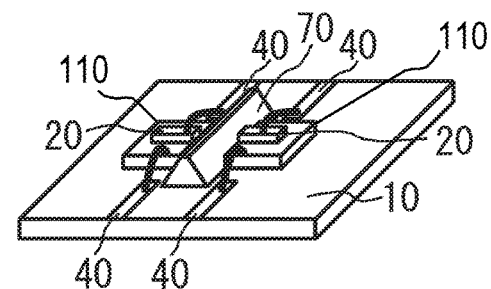
FIG. 2B is a schematic exploded view in FIG. 2A.

The radiating body 50 may be directly provided on the surrounding part 30 (refer to FIG. 1A to 1C) or may be provided on the surrounding part 30 via another member (refer to FIG. 2A to 2C).

The radiating body 50 can be connected to the surrounding part 30 or another member provided between the surrounding part 30 and the radiating body 50 using AuSn, low-melting point glass, or the like.

A material with a thermal conductivity of 100 W/mK or more is preferably used for the radiating body 50.

For example, materials with high heat radiation performance including metals such as copper and aluminum, ceramics such as an AlN sintered body and a SiC sintered body, or a combination of such metals and ceramics are used.

The radiating body 50 has an opening 51.

The plurality of semiconductor laser elements 20 are surrounded by the surrounding part 30 which reflects light emitted from the plurality of semiconductor laser elements 20. The light emitted from the plurality of semiconductor laser elements 20 is emitted to the outside of the surrounding part 30 by passing through the opening 51 of the radiating body 50 provided above the surrounding part 30. Therefore, in the light emitting device 1, an opening plane of the opening 51 constitutes a light emitting plane.

A shape of the opening 51 of the radiating body 50 is not particularly limited.

Examples of the shape of the opening 51 may include a cylinder, a truncated cone, a pyramidal frustum, and a rectangular parallelepiped.

Although not particularly limited, the opening 51 of the radiating body 50 preferably has an inner surface that is inclined such that the opening plane thereof becomes wider as it goes upward.

Accordingly, light extraction efficiency of the light emitting device 1 is improved.

Examples of such a shape include an inverted truncated cone and an inverted pyramidal frustum.

A reflective film can be provided on an inner surface of the radiating body 50.

Accordingly, since light absorbed by the radiating body 50 can be reflected by the reflective film, light extraction efficiency is improved.

As the reflective film, metals including Au, Ag, or Al can be used.

The wavelength converting member 60 is preferably provided inside the opening 51 of the radiating body 50.

In this case, the opening 51 of the radiating body 50 can be formed so that a peripheral edge thereof is farther inward than a peripheral edge of the surrounding part 30.

Accordingly, high-output light can be emitted without increasing a size of the light emitting plane. Furthermore, by concentrating light emitted from the plurality of semiconductor laser elements 20 on the wavelength converting member 60, light with high luminance can be emitted from the wavelength converting member 60.

The radiating body 50 is formed in, for example, a flat plate shape.

Accordingly, a heat sink or the like can be readily provided on an upper surface of the radiating body 50.

In addition, when the radiating body 50 has a flat plate shape, the opening 51 of the radiating body 50 (wavelength converting member 60) is positioned closer to the reflecting member 70 compared to a case where, for example, the radiating body 50 has a curved plane shape or the radiating body 50 has irregularities.

Accordingly, since light emitted from the plurality of semiconductor laser elements 20 enters and exits the wavelength converting member 60 before the light is completely diffused, the light emitting plane of the light emitting device 1 can be reduced and light with high luminance can be extracted from the light emitting device 1.

The peripheral edge of the radiating body 50 is positioned farther outward than, for example, the peripheral edge of the surrounding part 30.

Accordingly, heat of the wavelength converting member 60 can be more readily diffused.

A thermal conductivity of the radiating body 50 can be set higher than a thermal conductivity of the surrounding part 30.

Accordingly, since radiation via the radiating body 50 of heat generated at the wavelength converting member 60 is promoted, a decline in conversion efficiency of the wavelength converting member 60 due to heat can be suppressed.

While an area of an upper surface of the radiating body 50 may be equal to an area of an upper surface of the base 10, the area of the upper surface of the radiating body 50 may be greater than the area of the upper surface of the base 10.

When the area of the upper surface of the radiating body 50 is greater than the area of the upper surface of the base 10, heat generated at the wavelength converting member 60 is more readily discharged via the radiating body 50 than in a case where the area of the upper surface of the radiating body 50 is equal to the area of the upper surface of the base 10.

(Wavelength Converting Member 60)

The wavelength converting member 60 is provided in the opening 51 of the radiating body 50.

After being reflected by the reflecting member 70, the light emitted from the plurality of semiconductor laser elements 20 enters the wavelength converting member 60, whereby a part of the light is subjected to wavelength conversion and then emitted from the wavelength converting member 60.

The wavelength converting member 60 preferably has a plate shape.

While the wavelength converting member 60 may be provided in plurality, a single wavelength converting member 60 is provided as shown in FIG. 1A and the like in order to obtain light with high luminance.

A transmissive member containing a fluorescent body or the like can be used for the wavelength converting member 60.

In this case, the light emitted from the plurality of semiconductor laser elements 20 excites the fluorescent body contained in the transmissive member. As a result, light with a different wavelength from the light emitted from the plurality of semiconductor laser elements 20 is emitted from the fluorescent body and outputted from the transmissive member.

Non-coherent light is an example of light emitted from the wavelength converting member 60.

When semiconductor laser elements emitting blue light are used as the semiconductor laser elements 20, a fluorescent body that emits yellow light using excitation light from the semiconductor laser elements 20 can be used.

In this case, the light emitted from the wavelength converting member 60 is white light that is a mixture of blue light and yellow light.

Examples of a fluorescent body emitting yellow light include a YAG fluorescent body, a TAG fluorescent body, and a strontium silicate fluorescent body.

In addition, an inorganic member is preferably used as the transmissive member. For example, aluminum oxide, silicon oxide, titanium oxide, glass, or the like can be used.

Accordingly, the wavelength converting member 60 can be given high resistance to heat and light.

In the present embodiment, a sintered body of a YAG fluorescent body and aluminum oxide is used as the wavelength converting member 60.

A filter 80 which transmits light emitted from the plurality of semiconductor laser elements 20 and reflects light subjected to wavelength conversion at the wavelength converting member 60 may be provided below the wavelength converting member 60.

Accordingly, since the light extraction efficiency of the light emitting device 1 is improved, light with even higher luminance can be extracted from the light emitting device 1.

As the filter 80, for example, a member with reflectance of 90% or higher with respect to light which has a predetermined wavelength (light having a same wavelength as the light emitted from the plurality of semiconductor laser elements 20) and which enters at an incidence angle of 45 degrees or more can be used.

A part of light entering the wavelength converting member 60 from under the wavelength converting member 60 (light emitted from the plurality of semiconductor laser elements 20) is reflected inside the wavelength converting member 60 and which attempts to exit the wavelength converting member 60 in a downward direction.

However, by using the member described above as the filter 80, such light is efficiently reflected by the filter 80 and returned to the inside of the wavelength converting member 60.

As a result, the light extraction efficiency of the light emitting device 1 is improved and light with even higher luminance can be extracted from the light emitting device 1.

(Heat Sink)

An upper surface of the radiating body 50 can be connected to a heat sink.

Accordingly, heat radiation performance of the light emitting device 1 as a whole is improved.

In addition, even in a case where heat dissipation is difficult through a path from lower surface of radiating body 50 to surrounding part 30 due to low thermal conductivity of the surrounding part 30, heat dissipation can be performed through a path from upper surface of radiating body 50 to heat sink.

[Light Emitting Device 2 According to Second Embodiment]

FIG. 2A is a schematic perspective view of a light emitting device 2 according to a second embodiment, FIG. 2B is a perspective exploded view in FIG. 2A, and FIG. 2C is a perspective end view taken along a line A-A in FIG. 2A.

In FIG. 2A, portions of members are transparently shown using dashed lines in order to facilitate understanding in a similar manner to FIG. 1A.

As shown in FIG. 2A to 2C, the light emitting device 2 according to the second embodiment differs from the light emitting device 1 according to the first embodiment in that a cap 90 having an opening 91 is provided between the surrounding part 30 and the radiating body 50.

The opening 91 of the cap 90 is provided so that the opening 91 of the cap 90 at least partially overlaps with the opening 51 of the radiating body 50 so as to enable light to be emitted from the opening 51 of the radiating body 50.

With the light emitting device 2 according to the second embodiment, a material with high heat radiation performance can be used in the radiating body 50 while ensuring airtightness with the cap 90.

The opening 91 of the cap 90 is preferably provided with a sealing member 100 as shown in FIG. 2A to 2C.

Accordingly, the plurality of semiconductor laser elements 20 can be hermetically sealed.

As a result, since a decline in output due to optical dust collection or the like is further suppressed, the life of the light emitting device can be further prolonged.

A transmissive member such as ceramics and glass can be used as the sealing member 100.

In order to provide hermetic sealing, preferably, the cap 90 and the surrounding part 30 are welded together. To this end, preferably, the entire cap 90 or at least an end portion of the cap 90 on a side in contact with the surrounding part 30 and the entire surrounding part 30 or at least an end portion of the surrounding part 30 on a side in contact with the cap 90 are constructed from metal members.

Known materials can be used as a material of the cap 90.

For example, when the cap 90 and the surrounding part 30 are to be joined together by welding, a material with weldability such as kovar can be used as the material of the cap 90.

In addition, when the cap 90 and the surrounding part 30 are to be joined together by AuSn or low-melting point glass, ceramics or metals other than kovar can be used as the material of the cap 90.

Joining the cap 90 and the surrounding part 30 by welding only at joint portions, it is possible to join the cap 90 and the surrounding part 30 without causing thermal deterioration of the semiconductor laser elements 20 and the like.

(Heat Sink)

Figure 3A:
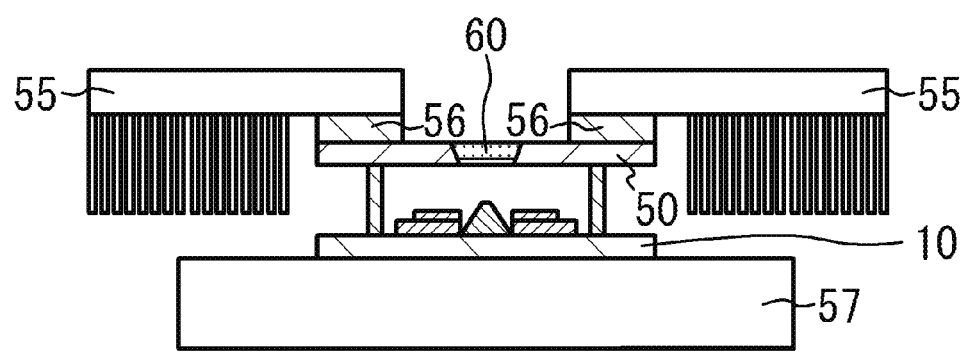
FIGS. 3A and 3B are a cross-sectional view and a plan view, respectively, showing an example of a light emitting device including a heat sink.
Figure 3B:
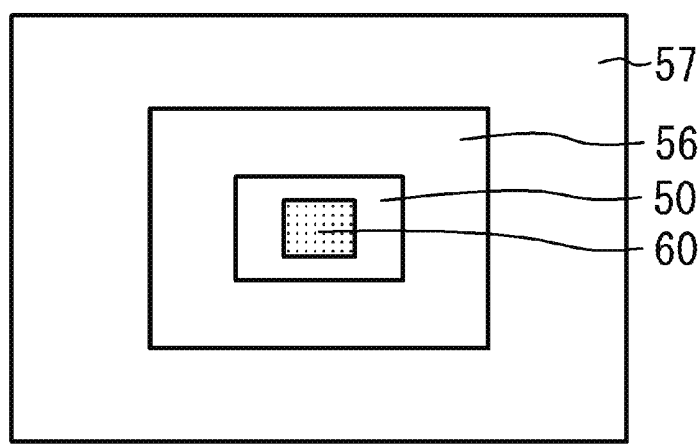

FIGS. 3A and 3B are a sectional view and a plan view, respectively, showing an example of a light emitting device including a heat sink.

In FIG. 3B, illustration of radiating fins 55 is omitted to make positions where temperature regulators 56 are arranged easily recognizable.

As shown in FIGS. 3A and 3B, the heat sink includes the radiating fins 55 and the temperature regulators 56.

The radiating fins 55 are constructed from, for example, aluminum or copper.

In addition, the temperature regulators 56 are constituted by, for example, Peltier elements.

As shown in FIGS. 3A and 3B, the light emitting device may further include a heat radiating platform 57.

The heat radiating plate 57 is connected to, for example, an entire lower surface of the base 10.

Accordingly, heat generated by a plurality of semiconductor laser elements 20 is more easily discharged to the heat radiating plate 57.

While embodiments of the present invention have been described above, the description merely represents examples thereof and is not intended to limit the configurations described in the claims in any way whatsoever.

EXPLANATION OF REFERENCE NUMERALS

1 Light emitting device
2 Light emitting device
10 Base
20 Semiconductor laser element
30 Surrounding part
40 Wiring part
50 Radiating body
51 Opening of radiating body
55 Radiating fin
56 Temperature regulator
57 Heat radiating plate
60 Wavelength converting member
70 Reflecting member
80 Filter
90 Cap
91 Opening of cap
100 Sealing member

What is claimed is:

1. A light emitting device comprising:
   a base;
   one or more semiconductor laser elements disposed on the base and configured to emit light laterally;
   a reflecting member that is disposed on the base and configured to reflect the light from at least one of the one or more semiconductor laser elements;
   a surrounding part that is disposed on the base and that surrounds the one or more semiconductor laser elements and the reflecting member, wherein the surrounding part defines a first opening in which the one or more semiconductor laser elements and the reflecting member are disposed;
   a cap that includes an upper portion defining a second opening, a lower portion disposed on the surrounding part, and a central portion extending between the upper portion and the lower portion, the central portion defining a third opening, wherein the third opening is smaller than the first opening, and wherein the second opening is smaller than the first and third openings;

a radiating body disposed on the upper portion of the cap, the radiating body comprising at least one of a metal and a ceramic, and the radiating body having a fourth opening; and a wavelength converting member that is located in the fourth opening of the radiating body, the wavelength converting member being configured to convert a wavelength of the light that is emitted from the one or more semiconductor laser elements and reflected through the second opening.

2. The light emitting device according to claim 1, wherein the radiating body is formed in a flat plate shape and a peripheral edge of the radiating body is positioned farther outward than a peripheral edge of the surrounding part.

3. The light emitting device according to claim 1, wherein a thermal conductivity of the radiating body is higher than a thermal conductivity of the surrounding part.

4. The light emitting device according to claim 1, further comprising, below the wavelength converting member, a filter that is configured to transmit light emitted from the one or more semiconductor laser elements and to reflect light subjected to wavelength conversion by the wavelength converting member.

5. The light emitting device according to claim 1, wherein the fourth opening of the radiating body has an inner surface that is inclined such that an opening plane thereof becomes wider as it goes upward.

6. The light emitting device according to claim 1, further comprising:
a transmissive member located below the wavelength converting member and closing the second opening;
wherein the cap is located between the surrounding part and the radiating body,
wherein the second opening at least partially overlaps with the fourth opening, and
wherein the light that passes through the second opening passes through the transmissive member, and the light that passes through the transmissive member passes through the wavelength converting member.

7. The light emitting device according to claim 1, wherein an area of an upper surface of the radiating body is greater than an area of an upper surface of the base.

8. The light emitting device according to claim 1, wherein the radiating body comprises copper or aluminum.

9. The light emitting device according to claim 1, wherein the radiating body comprises an AlN sintered body or a SiC sintered body.

10. The light emitting device according to claim 1, further comprising a heat sink, wherein the heat sink is disposed on an upper surface of the radiating body so as not to cover the fourth opening.

11. The light emitting device according to claim 1, wherein a peripheral edge of the fourth opening of the radiating body is formed so as to be farther inward than a peripheral edge of the surrounding part.

12. The light emitting device according to claim 1, wherein the base comprises aluminum nitride or aluminum oxide.

13. The light emitting device according to claim 1, wherein:
the wavelength converting member comprises a transmissive member comprising a fluorescent body,
the fluorescent body comprises at least one of a YAG fluorescent body, a TAG fluorescent body and a strontium silicate fluorescent body, and
the transmissive member comprising the fluorescent body comprises an inorganic member.

14. The light emitting device according to claim 1, further comprising a heat radiating plate,
wherein the heat radiating plate is connected to an entirety of a lower surface of the base.

15. The light emitting device according to claim 1, wherein the one or more semiconductor laser elements comprise a plurality of semiconductor laser elements.

16. The light emitting device according to claim 1, wherein the surrounding part is made of a ceramic material or a metal material.

17. The light emitting device according to claim 1, further comprising:
one or more sub-mounts disposed on the base, wherein exactly one of the one or more semiconductor laser elements is disposed on each of the one or more sub-mounts.

18. The light emitting device according to claim 1, further comprising:
a plurality of wiring part parts that are electrically connected to the one or more semiconductor laser elements and that is disposed on an upper surface of the base so as to extend laterally to a location on the upper surface of the base that is laterally outside of the surrounding part.

19. The light emitting device according to claim 1, wherein an inner periphery of the cap at the bottom portion of the cap is located inward of an inner periphery of the surrounding part at a top of the surrounding part.

20. The light emitting device according to claim 2, wherein a thermal conductivity of the radiating body is higher than a thermal conductivity of the surrounding part.

21. The light emitting device according to claim 2, further comprising:
a transmissive member located below the wavelength converting member and closing the second opening;
wherein the cap is located between the surrounding part and the radiating body,
wherein the second opening at least partially overlaps with the fourth opening, and
wherein the light that passes through the second opening passes through the transmissive member, and the light that passes through the transmissive member passes through the wavelength converting member.

22. The light emitting device according to claim 2, wherein an area of an upper surface of the radiating body is greater than an area of an upper surface of the base.

23. The light emitting device according to claim 4, wherein the filter has a reflectance of 90% or more with respect to light that has a predetermined wavelength and that enters at an incidence angle of 45 degrees or more, and the predetermined wavelength is a wavelength of light emitted from the one or more semiconductor laser elements.

24. The light emitting device according to claim 10, wherein the heat sink comprises a radiating fin and a temperature regulator.

25. The light emitting device according to claim 17, wherein the reflecting member is disposed on the base without the one or more sub-mounts disposed therebetween.

26. The light emitting device according to claim 17, wherein:
the one or more sub-mounts comprises a first sub-mount, and a second sub-mount that is spatially separated from the first sub-mount, and
the one or more semiconductor laser elements comprises a first semiconductor laser element disposed on the first sub-mount, and a second semiconductor laser element disposed on the second sub-mount.

27. The light emitting device according to claim 18, wherein each of the wiring parts has a length in a length direction and a width in a width direction, the length being greater than the width, and wherein the length direction of each of the wiring parts is perpendicular to a direction in which light is emitted from the semiconductor laser elements.

28. The light emitting device according to claim 26, wherein:
   the reflecting member is disposed on the base without the one or more sub-mounts disposed therebetween, at a location laterally between the first sub-mount and the second sub-mount.

\* \* \* \* \*